(12) United States Patent
Andrews et al.

(10) Patent No.: US 7,443,192 B1
(45) Date of Patent: Oct. 28, 2008

(54) OUTPUT BUFFER WITH DIGITAL SLEW CONTROL

(75) Inventors: William B. Andrews, Macungie, PA (US); Mou C. Lin, High Bridge, NJ (US); John A. Schadt, Bethlehem, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/643,288

(22) Filed: Dec. 21, 2006

(51) Int. Cl.
*H03K 19/003* (2006.01)

(52) U.S. Cl. .......................... 326/29; 326/30

(58) Field of Classification Search ............. 326/26, 326/27, 29, 30, 17
See application file for complete search history.

(56) References Cited

U.S. PATENT DOCUMENTS

| | | | |
|---|---|---|---|
| 5,838,186 A * | 11/1998 | Inoue et al. ................. | 327/389 |
| 5,859,552 A * | 1/1999 | Do et al. ...................... | 327/170 |
| 6,480,026 B2 | 11/2002 | Andrews et al. ............. | 326/39 |
| 6,967,500 B1 | 11/2005 | Lin et al. ...................... | 326/30 |
| 7,009,433 B2 | 3/2006 | Zhang et al. ................. | 327/158 |

* cited by examiner

*Primary Examiner*—James H Cho
(74) *Attorney, Agent, or Firm*—Steve Mendelsohn

(57) ABSTRACT

An improved output buffer having a digital output slew control and compensation for manufacturing process variations. Output slewing is accomplished by sequencing digital drive signals to paralleled output transistors. In one embodiment, a pre-driver sequences the drive signals by using the propagation delays of serially coupled digital logic gates to reduce power supply droop and/or ground bounce. The output transistors are turned off substantially simultaneously to avoid undesirable power supply DC current flow when the output buffer changes state. Programmably configuring the number of paralleled transistors that may be turned on at any given time allows a user to compensate for manufacturing process variations and determine the output impedance/drive capacity of the buffer.

18 Claims, 3 Drawing Sheets

FIG. 3

For pre-driver 112 in slice 110_i:

| STEP # | INPUT SIGNALS: ENABLE-SOURCE_i | SOURCE_DATA | SLEW 114_i | FAST | TYP | SLOW | OUTPUTS: $113_F$ | $113_T$ | $113_S$ | $113_P$ | REMARKS: |
|---|---|---|---|---|---|---|---|---|---|---|---|
| 301 | 0 | — | — | — | — | — | — | — | — | — | slice disabled |
| 302 | 1 | 1 | 0 | 1 | 1 | 0 | 1 | 1 | 1 | 1 | non-slew mode; all output transistors off |
| 303 | 1 | 1 | 0 | 1 | 1 | 0 | 0 | 0 | 1 | 1 | non-slew mode; all but slow transistor turns on |
| 304 | 1 | 0 | 0 | 1 | 1 | 0 | 1 | 1 | 1 | 1 | non-slew mode; all output transistors off |
| 305 | 1 | 1 | 0 | 1 | 1 | 1 | 0 | 0 | 0 | 1 | non-slew mode; all output transistors on |
| 306 | 1 | 0 | 0 | 1 | 1 | 1 | 1 | 1 | 1 | 1 | non-slew mode; all output transistors off |
| 307 | 1 | 0 | 1 | 1 | 1 | 1 | 1 | 1 | 1 | 0 | slew mode; all output transistors off and waiting for seq. enable signal |
| 308 | 1 | 0 | 1 | 0 | 1 | 1 | 0 | 1 | 1 | 0 | slew mode; 1st (fast) transistor turns on |
| 309 | 1 | 0 | 1 | 0 | 0 | 1 | 0 | 0 | 1 | 0 | slew mode; 2nd (typical) transistor turns on |
| 310 | 1 | 0 | 1 | 0 | 0 | 0 | 0 | 0 | 0 | 0 | slew mode; 3rd (slow) transistor turns on |
| 311 | 1 | 0 | 1 | 0 | 0 | 0 | 0 | 0 | 0 | 1 | slew mode; enable next pre-driver in slice $110_{i+1}$ |
| 312 | 1 | 1 | 1 | 1 | 1 | 1 | 1 | 1 | 1 | 0 | slew mode; all output transistors turn off |

For pre-driver 212 in slice $210_i$:

| STEP # | INPUT SIGNALS: ENABLE-SINK_i | SINK_DATA | SLEW 214_i | FAST | TYP | SLOW | OUTPUTS: $213_F$ | $213_T$ | $213_S$ | $213_P$ | REMARKS: |
|---|---|---|---|---|---|---|---|---|---|---|---|
| 401 | 0 | — | — | — | — | — | — | — | — | — | slice disabled |
| 402 | 1 | 1 | 0 | 0 | 0 | 0 | 0 | 0 | 0 | 0 | non-slew mode; all output transistors off |
| 403 | 1 | 0 | 0 | 0 | 0 | 0 | 1 | 1 | 0 | 0 | non-slew mode; all but slow transistor turns on |
| 404 | 1 | 1 | 0 | 0 | 0 | 0 | 0 | 0 | 0 | 0 | non-slew mode; all output transistors off |
| 405 | 1 | 0 | 0 | 0 | 0 | 1 | 1 | 1 | 1 | 0 | non-slew mode; all output transistors on |
| 406 | 1 | 1 | 0 | 0 | 0 | 1 | 0 | 0 | 0 | 0 | non-slew mode; all output transistors off |
| 407 | 1 | 1 | 1 | 1 | 1 | 1 | 0 | 0 | 0 | 1 | slew mode; all output transistors off and waiting for seq. enable signal |
| 408 | 1 | 1 | 1 | 1 | 1 | 1 | 1 | 0 | 0 | 1 | slew mode; 1st (fast) transistor turns on |
| 409 | 1 | 1 | 1 | 1 | 1 | 1 | 1 | 1 | 0 | 1 | slew mode; 2nd (typical) transistor turns on |
| 410 | 1 | 1 | 1 | 1 | 1 | 1 | 1 | 1 | 1 | 1 | slew mode; 3rd (slow) transistor turns on |
| 411 | 1 | 1 | 1 | 1 | 1 | 1 | 1 | 1 | 1 | 0 | slew mode; enable next pre-driver in slice $210_{i+1}$ |
| 412 | 1 | 0 | 1 | 1 | 1 | 1 | 0 | 0 | 0 | 1 | slew mode; all output transistors turn off |

OUTPUT BUFFER WITH DIGITAL SLEW CONTROL

TECHNICAL FIELD

The present invention relates to programmable logic devices, such as field-programmable gate arrays (FPGAs), and, in particular, to the output buffers in such devices.

BACKGROUND

Complicated digital integrated circuits, such as FPGAs, microprocessors, application-specific integrated circuits (ASICs), or the like (generally, chips), have a large number of output buffers for driving output signals off-chip. The output buffers generally change state in unison, which causes large currents with fast times (high dI/dt) to flow in the power supply and ground buses on the chip. Because of the self-inductance of the buses, the fast current flows result in voltage transients on the power supply and ground buses. The transients on the power supply bus and the ground bus are generally referred to as power supply droop and ground bounce, respectively. If the voltage transients are significant enough, the chip may intermittently fail. a common technique to reduce the voltage transients is to slow down the switching speed of each output buffer by limiting the drive current to the output transistors of each buffer, thereby slowing the rate that the transistors switch from turned-off to fully turned-on. However, this technique significantly complicates the output buffer circuitry and might sufficiently weaken the buffer during output signal transitions such that the output signals from the buffer becomes unacceptably susceptible to crosstalk from other near-by signals.

SUMMARY

In one embodiment, the invention is a programmable logic device comprising an output buffer, the output buffer comprising a first plurality of output transistors and a first set of one or more pre-drivers. Each of the output transistors has a control terminal and two output terminals. The first set of pre-drivers is adapted to generate a plurality of control signals, each control signal coupled to the control terminal of a corresponding output transistor of the first plurality of output transistors. The control signals are generated to sequentially turn on two or more of the first plurality of output transistors and the first plurality of output transistors have paralleled output terminals between a first reference node and an output node.

In another embodiment, the invention is a programmable device comprising an output buffer, the output buffer comprising at least two first-polarity output transistors and at least first and second pre-drivers. Each of the at least first-polarity output transistors has a control terminal and two output terminals. The first and second pre-drivers have at least first and second input nodes and at least first and second output nodes. Each first output node couples to a corresponding one of the control terminals of the two output transistors, the second input node of the second pre-driver couples to the second output node of the first pre-driver, and the first input node of the at least first and second pre-drivers are driven by a first input signal. The first and second pre-drivers are each adapted to be programmably configured to operate in a non-slew mode and a slew mode. In the non-slew mode, in response to the first input signal being asserted, an output signal is asserted on the first output node. In the slew mode, in response to the first input signal on the first input node and an input signal on the second input node being concurrently asserted, an output signal is asserted on the first output node and an output signal is asserted the second output node, the assertion of the output signal on the second output node being delayed with respect to the assertion of the output signal on the first output node. The output terminals of the at least two first-polarity output transistors are coupled in parallel between a first node an output node, and the first node is adapted to couple to a first power source.

In still another embodiment, the invention comprises the steps of sequentially sourcing a plurality of currents to an output node in response to a first signal being asserted, and terminating the sourcing of the plurality of currents to the output node substantially simultaneously upon negation of the first signal.

BRIEF DESCRIPTION OF THE DRAWINGS

The aspects, features, and advantages of the present invention will become more fully apparent from the following detailed description, the appended claims, and the accompanying drawings in which like references numerals identify similar or identical elements.

FIG. 3 contains two tables illustrating exemplary operations and configurations of the output buffer shown in FIGS. 1 and 2.

DETAILED DESCRIPTION

Figure 1:
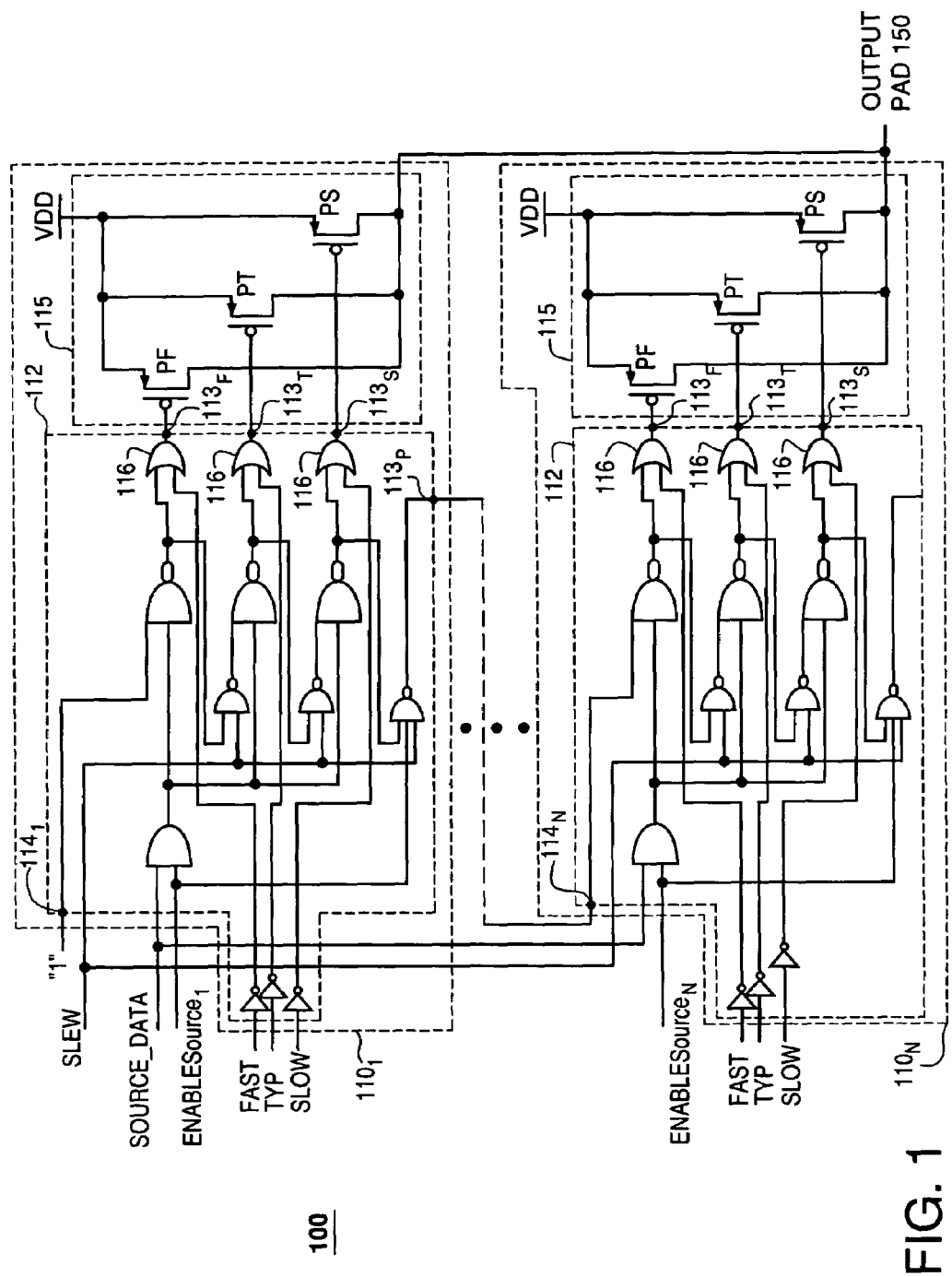
FIGS. 1 and 2 are simplified schematic diagrams of different portions of an output buffer according to one exemplary embodiment of the present invention.

For purposes of this description and unless explicitly state otherwise, each numerical value and range should be interpreted as being approximate as if the word "about" or "approximately" preceded the value of the value or range. Further, reference herein or "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected," refer to any manner known in the art or later developed in which energy is allowed to be transferred between two or more elements and the interposition of one or more additional elements is contemplated, although not required. Conversely, the terms "directly coupled," "directly connected," etc., imply the absence of such additional elements.

Also, for purposes of this description, it is understood that all circuits are powered from a fixed-voltage power source and ground unless shown otherwise. Accordingly, all digital signals generally have voltages that range from approximately ground potential to that of one of the power source and transition (slew) quickly. However and unless stated otherwise, ground may be considered a power source having a voltage of approximately zero volts and a power source having any desired voltage may be substituted for ground. Therefore, all gates may be powered by at least two power sources, with the attendant digital signals therefrom having voltages that range between the approximate voltages of the power sources. Further, all digital signals have one of two logical values, the values being referred to herein as a logical high (also referred to herein as a logical one) or a logical low (also referred to herein as a logical zero). Generally, the voltage of a logical high signal is a more positive than the voltage of a logical low signal.

Signals and corresponding nodes, ports, inputs, or outputs may be referred to by the same name and are interchangeable for purposes here. Accordingly and unless stated otherwise, reference to an "active" signal or a signal being "asserted" means, for purposes here, that the signal is of the appropriate logic value (a logical high or logical low) to effect a certain action.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel in series or in combination with other active or passive devices, e.g., resistors, to get desired electrical characteristics from the combination. Further, the illustrated transistors may be composite transistors.

As used in this specification and claims, the term "output node" refers generically to either the source, or drain of a metal-oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when the present invention is implemented using bi-polar transistor technology.

Figure 2:
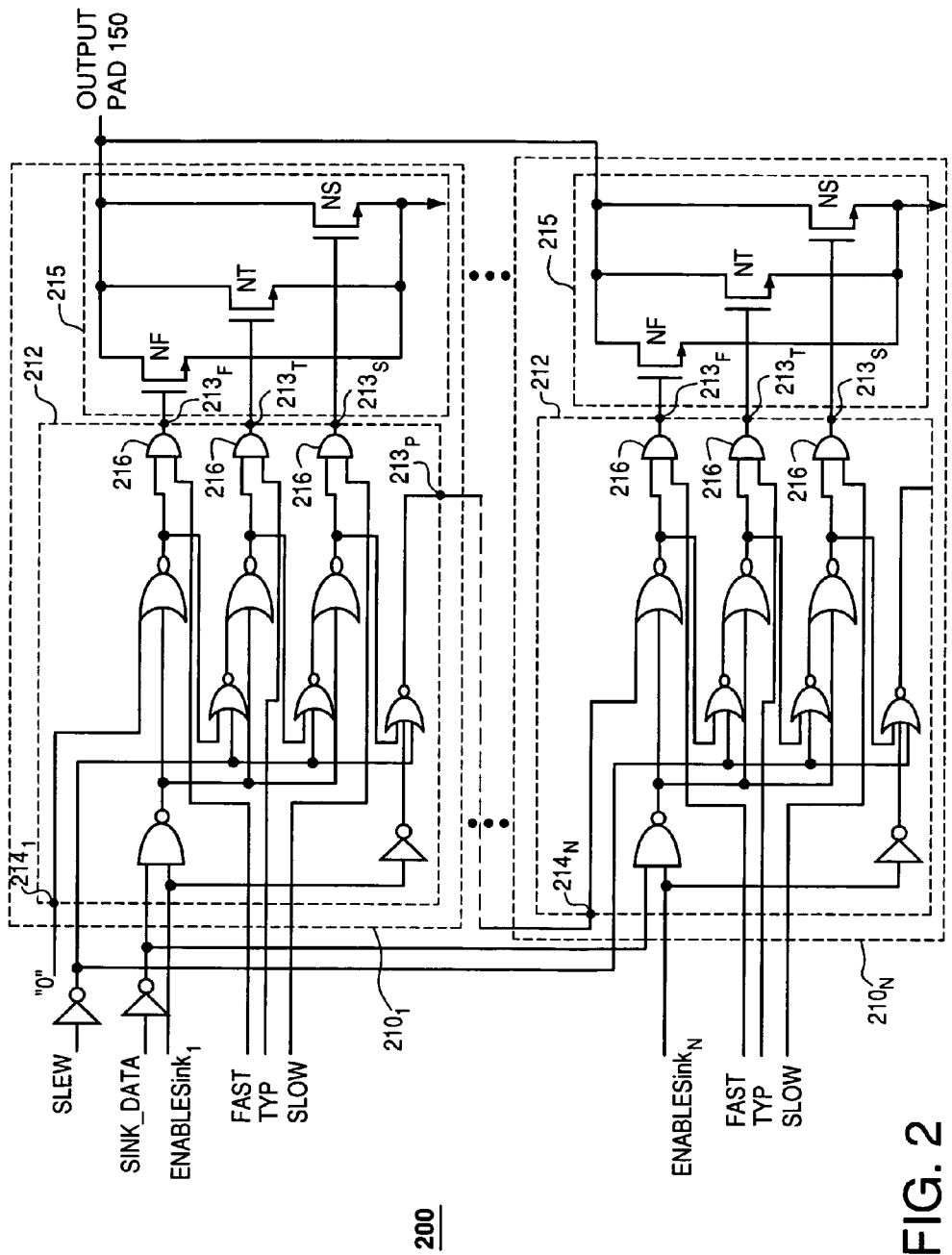

The simplified schematic diagrams in FIGS. 1 and 2 together disclose an output buffer (not numbered) of an exemplary embodiment of the invention that is preferably implemented in an integrated circuit. The source circuitry 100 in FIG. 1 selectively sources current from the $V_{DD}$ power source to an output node, here an output pad 150 on the integrated circuit. The sink circuitry 200 in FIG. 2 selectively sinks current from the output pad 150 to ground. The circuitry 200 may be thought of as the complement to, or having the opposite polarity of, the circuitry 100. Operation of the circuitry in FIG. 1 is analogous to that in FIG. 2, as will be discussed in more detail below.

In FIG. 1, the source circuitry 110 comprises N (N≧1) source slices $110_1$-$110_N$, each source slice having a pre-driver 112 and a driver 115. As will be explained in more detail below, each pre-driver 112 receives control signals SOURCE_DATA, FAST, TYP, SLOW, SLEW, and a corresponding enable signal ENABLESource$_i$ (1≦i≦N). Each driver 115, in one embodiment, has three approximately equal-sized output transistors PF, PT, and PS, here p-channel transistors, with paralleled output terminals and separate control terminals. The transistors in driver 115 selectively source current from power source $V_{DD}$ to the output pad 150. Digital signals on output nodes $113_F$, $113_T$, and $113_S$ of the pre-driver 112 drive the corresponding control terminals of the output transistors PF, PT, and PS for controlling the conduction thereof.

Similarly and in correspondence with the circuitry in FIG. 1, the sink circuitry 200 in FIG. 2 comprises N sink slices $210_1$-$210_N$, each sink slice having a pre-driver 212 and a driver 215. As will be explained in more detail below, each pre-driver 212 receives control signals SINK_DATA, FAST, TYP, SLOW, SLEW, and a corresponding enable signal ENABLESink$_i$ (1≦i≦N). Each driver 215, one embodiment, has three approximately equal-sized output transistors NF, NT, and NS, here n-channel transistors, with paralleled output terminals and separate control terminals. The transistors in driver 215 selectively sink current from the output pad 150 to ground. Digital signals on output nodes $213_F$, $213_T$, and $213_S$ of the pre-driver 212 drive the corresponding control terminals of the output transistors NF, NT, and NS for controlling the conduction thereof. Although an equal number (N) of source slices and sink slices are shown in the exemplary embodiment, it is understood that there may be more or fewer source slices than sink slices.

While it is desirable for all the output transistors in the slices $110_1$-$110_N$ to be the same size (as well as those in slices $210_1$-$210_N$), it is understood that the sizes of the output transistors PF, PT, PS and NF, NT, NS may be changed to meet design requirements. For example, the sizes of the output transistors in slice $110_1$ may be different from corresponding output transistors in slice $110_N$, and/or the size of output transistor PF may be different from the size of output transistor PT and/or PS in slice $110_1$. This provides a user of the output buffer the flexibility to select which output transistors (or combination of transistors) to use to meet functionality requirements of the buffer, such as output impedance and minimum drive current capability. Moreover, the number of enabled source slices $110_1$-$110_N$ is desirably the same as the number of enabled sink slices $210_1$-$210_N$, where the number of enabled source/sink slices may be chosen by a user to provide the desired output drive capability and/or output impedance of the output buffer. In this exemplary embodiment, the first source slice $110_1$ and first sink slice $210_1$ are generally used as first ones of the desired number of source and sink slices being selected by a user through programming the ENABLESource$_1$-ENABLESource$_N$ and ENABLESink$_1$-ENABLESink$_N$ input signals to corresponding input nodes, respectively. It is understood that it may be desirable to use only source slices or only sink slices in certain implementations. Further, unequal numbers of source and sink slices may be used, and/or selected ones of the slices other than the first slices $110_1$, $210_1$ may be used.

The input signals FAST, TYP, and SLOW are control signals used to select the number of transistors in each driver 115/215 that are turned-on at any given time. By virtue of the OR gates 116 in pre-drivers 112 (FIG. 1) and AND gates 216 in pre-drivers 212 (FIG. 2), the FAST, TYP, and SLOW signals either allow or inhibit control signals from reaching the corresponding output transistors in drivers 115/215. Generally and in this particular embodiment, the FAST signal is always asserted and the TYP and/or SLOW signals may be asserted depending upon the electrical characteristics of the transistors in the driver 115/215. Because of process variations during manufacturing, the electrical characteristics of the transistors can be better than typical (e.g., a "fast" process), typical, or worse than typical (a "slow" process). For example, if during manufacture the process was "fast," then only one transistor in each driver is usually required (transistors PF/NF in this example) and only the FAST signal is asserted. For a "typical" process, two transistors are usually required (the PF/NF and PT/NT transistors in this example) and only the FAST and TYP signals are asserted. If, however, the process was "slow," then all the transistors are typically required and all three FAST, TYP, and SLOW signals are asserted. The FAST, TYP, and SLOW signals are programmable and are under the control of a user. Alternatively, the FAST, TYP, and SLOW signals may be determined automatically by a reference monitor circuit, such as that disclosed in U.S. Pat. No. 6,480,026 by Andrews et al., assigned to the same assignee as this invention, and incorporated herein by reference in its entirety. For purposes here and to simplify the description of the invention, it is assumed that all three input signals, FAST, TYP, and SLOW are asserted, so that all the output transistors PF, PT, and PS in each enabled slice $110_1$-$110_N$ (and NF, NT, and NS in each enabled slice $210_1$-$210_N$ in FIG. 2) are used.

The input signals $ENABLESource_1$-$ENABLESource_N$ enable operation of the corresponding source slices $110_1$-$110_N$ and, correspondingly, the input signals $ENABLESink_1$-$ENABLESink_N$ enable operation of the corresponding sink slices $210_1$-$210_N$. For example, if the enable signal $ENABLESource_1$ or $ENABLESink_1$ is not asserted (e.g., the signals having a value of logical zero in this example), then the corresponding pre-drivers 112/212 are disabled so that the transistors in the corresponding driver 115/215 cannot turn on no matter what the value of the FAST, TYP, and SLOW input signals.

Signals on the SOURCE_DATA and SINK_DATA input nodes are data signals for the output buffer to drive to the output pad 150. Assertion of a signal on the SOURCE_DATA input node (a logical high in this example) will allow enabled pre-drivers 112 to drive the output transistors in corresponding drivers 115 into conduction. Similarly, assertion of a signal on the SINK_DATA input node (a logical low in this example) will allow enabled pre-drivers 212 to drive the output transistors in corresponding drivers 215 into conduction. It is understood that the SOURCE_DATA and SINK_DATA input nodes may be driven with a common data signal from a common input node (not shown).

As will be illustrated by example below, for each slice $110_i$, an input node $114_i$ enables sequencing of the corresponding output signals on output nodes $113_F$, $113_T$, and $113_S$ when the SLEW input signal is asserted (e.g., a logical high in this example). the output node $113_P$ for each slice $110_i$ ($1 \leq i \leq N-1$) couples top the input node $114_{i+1}$ of the subsequent slice $110_{i+1}$ to control the sequencing of the output signals on corresponding output nodes $113_F$, $113_T$, and $113_S$ between slices. Hence, input node $114_1$ of slice $110_1$ is tied to a fixed logical high value ("1"). Operation of the slices $210_1$-$210_N$ is essentially the same as described for slices $110_1$-$110_N$, except that the input node $214_1$ of slice $210_1$ is tied to a fixed logical low value ("0").

The functionality of pre-drivers $110_1$-$110_N$ and $210_1$-$210_N$ is best understood by way of operational examples. For the following example, the input signals $ENABLESource_1$-$ENABLESource_N$ and $ENABLESink_1$-$ENABLESink_N$ are all asserted (e.g., all the input nodes are at logical high) and the SLEW input signal is not asserted (e.g., it is a logical low). In this example, when the SOURCE_DATA input node goes from logical low to logical high, all of the output transistors in the drivers 115 turn on substantially simultaneously. Similarly, when the SOURCE_DATA input node goes from logical high to logical low, then all the transistors in drivers 115 turn off substantially simultaneously. It is the simultaneous turn-on of all the output transistors in drivers 115 (particularly with a significant capacitive load on output pad 150) that causes the above-described $V_{DD}$ power supply droop problem (and/or the above-described ground bounce problem in the case of simultaneously turning on all of the transistors in the drivers 215 of FIG. 2 when the SINK_DATA input node goes from logical high to logical low).

Alternatively and again assuming that the enable signals $ENABLESource_1$-$ENABLESource_N$ are all asserted (e.g., the input nodes are all at logical high) and the SLWE input signal is asserted (e.g., it is a logical high), when the SOURCE_DATA input node goes from logical low to logical high, the output transistors in all the drivers 115 sequentially turn on, reducing the power supply droop (and/or the ground bounce in the case of the drivers 215 shown in FIG. 2) because the dI/dt on the power supply bus (and the ground bus) is less than the case when all the transistors are turned on simultaneously. In this example, the transistor PF in slice $110_1$ is the first to turn on, followed by PT, then PS in slice $110_1$. Then, transistor PF in slice $110_2$ (not shown) turns on, followed by PT, then PS in the same slice $110_2$. Eventually, transistor PF in slice $110_N$ turns on, followed by PT, then finally PS, in the slice $110_N$. The delay between the transistors being turned on results from propagation delays through serially coupled digital gates (shown, but not numbered) in each pre-driver 112, although the amount of delay desired can be obtained by other means known in the art, including programmably selecting the amount of delay applied to the control signals driving the output transistors. A sequencing enable signal from output $113_P$ of each slice $110_i$ to the input node $114_{i+1}$ of the corresponding subsequent slice $110_{i+1}$ allows the slices $110_1$-$110_N$ to sequence in the desired order when the SLEW signal is asserted (SLEW=logical high). Note that, even if any one or more of the slices $110_1$-$110_{N-31\ 1}$ are disabled (i.e., one or more of the $ENABLESource_1$-$ENABLESource_{N-1}$ signals is a logical low), the subsequent, non-disabled slice may still sequence the transistors therein because the output node $113_P$ of a disabled slice still asserts a logical high sequencing enable signal to the subsequent slice input node $114_{i+1}$, as shown in the tables of FIG. 3 and as discussed below. Accordingly and as explained above, the input node $114_1$ to slice $110_1$ is tied logical high so that the slice is ready for sequencing of the transistors therein if the slice $110_1$ is enabled, as is input node $214_1$ to slice $210_1$ tied logical low to permit sequencing of the transistors therein if the slice $210_1$ is enabled. It is understood that, if the slices $110_1$-$110_N$ (and $210_1$-$210_N$) are not in the slew mode (SLEW=logical low), then it is desirable that the input nodes $114_i$ ($214_i$) have no effect on the operation of the corresponding slice $110_i$ ($210_i$). In this embodiment, the output $113_P$ of each slice $110_1$-$110_N$ is forced to logical high (and, correspondingly, the output $213_P$ of each slice $210_1$-$210_N$ is forced to logical low) when the SLEW signal is logical low.

Sequencing of the stages $110_1$-$110_N$ will still happen if fewer than all the FAST/TYP/SLOW input signals are asserted. For example, if only the FAST input signal is asserted, only the PF transistor in each enabled slice $110_1$-$110_N$ (and NF transistor in each enabled slice $210_1$-$210_N$) will be sequentially turned on, slice-by-slice.

In the above-described exemplary embodiment, all the output transistors in the drivers 115 are turned off substantially simultaneously regardless of the value of the SLEW input node because all the digital output signals on output nodes $113_F$, $113_T$, and $113_S$ are negated when the SOURCE_DATA input node goes to a logical zero. Similarly, all of the output transistors in divers 215 are turned off substantially simultaneously regardless of the value of the SLEW input node because the all the digital output signals on output nodes $213_F$, $213_T$, and $213_S$ are negated when the SINK_DATA input node goes to a logical one. The simultaneous turn-off of the output transistors substantially avoids any significant transient DC current path between $V_{DD}$ and ground through the output transistors in slices $110_1$-$110_N$, $210_1$-$210_N$ as either the source or sink slices are turned on and the complementary slices are turned off.

Operation of the pre-drivers 112/212 in slices $110_i/210_i$ is summarized in the tables shown in FIG. 3 for a subset of various input signal combinations. A "1" or "0" represents a logical high or logical low, respectively. Briefly, the steps 301-312 and 401-412 illustrate the operation of respective slices $110_i$ and $210_i$, for selected ones of the various input combinations that can be applied to the slices. Not all possible combinations are shown, e.g., not all possible combinations of the FAST/TYP/SLOW input signals are shown. Similar step numbers represent similar operations in the respective slices $110_i$ and $210_i$. Note that the input $114_i$ ($1<i\leq N$) is driven from output $113_P$ of a previous slice $110_{i-1}$. For the slice $110_i$, the input $114_1$ is driven by a fixed logical high, and for slice $210_1$, the input $214_1$ is driven by a fixed logical low.

For source slice $110_i$ at step 301, ENABLESource$_i$ is a logic low, such that slice $110_i$ is disabled and all the output transistors (PF, PT, PS) are off. In step 302, slice $110_i$ is enabled but because the SOURCE_DATA input signal is logical low, all the output transistors remain off.

At step 303, the SOURCE_DATA input signal is logical high and all the output transistors turn on except the SLOW transistor (PS) because the SLOW input signal is at logic low. Moreover, the enabled output transistors all turn on substantially simultaneously because the SLEW input signal is logical low.

At step 304, the SOURCE_DATA input signal is again logical low and all the output transistors turn off. Then at step 305, the SOURCE_DATA input signal is again logical high and because the SLOW input signal is now logical high, all the output transistors turn on. Moreover, the enabled output transistors all turn on substantially simultaneously because the SLEW input signal is logical low. At step 306, the SOURCE_DATA input signal is again logical low and all the output transistors once again turn off.

The steps 307-311 illustrate the sequential assertion of the output signals that turn on the output transistors while the SLEW input signal is asserted (SLEW=logical high). In step 307, all the output transistors in the slice $110_i$ are off but are ready for being turned-on in sequence once the sequencing enable signal on node $114_i$ goes logical high. Upon the enable signal on node $114_i$ going logical high, the first transistor PF (fast) is turned on as shown in step 308. Shortly thereafter, steps 309-311 occur quickly in automatic sequence, sequentially turning on the remaining transistors PT (typical) and PS (slow) and eventually asserting the sequencing enable signal on the output node $113_P$ to enable the subsequent slice $110_{i+1}$. At step 312, the SOURCE_DATA input signal is negated, all the output transistors turn off substantially simultaneously, and the received and transmitted sequencing enable signals (at $114_i$ and $113_P$, respectively) are disabled.

Analogous operations for sink slice $210_i$ are shown in steps 401-412.

The following illustrates a typical sequence of steps used by the slices $110_i/210_i$, ($1<i\leq N$) during operation of the exemplary output buffer. Operation of slices $110_1/210_1$ is similar to the following illustration but, as explained above, the inputs $114_1/214_1$ are held at fixed logical values since there is no previous slice for slices $110_1/210_1$ to wait for when in the slew mode (SLEW=logical high). In this illustration, the output buffer is configured with both slices $110_i/210_i$ enabled, the SOURCE_DATA input node and SINK_DATA input node are driven from a common data input node, and the SLEW input signal is logical high. Beginning with the common data input node having a logical high thereon and the sequencing enable signal $114_i$ and the sequencing enable signal $214_i$, both being logical high, the slice $110_i$ is at step 311 and the slice $210_i$ is at step 412. Upon the common input node going logical low, slice $110_i$ goes to step 312 and slice $210_i$ goes to step 407. Slice $210_i$ remains at step 407 until the sequence enable signal $214_i$ goes logical low (as driven by the output $213_P$ of the previous slice $210_{i-1}$ upon the slice $210_{i-1}$ reaching step 411), at which time slice $210_i$ goes to step 408 and quickly sequences to step 409, then step 401, and stopping at step 411, while slice $110_i$ remains at step 312. Next, upon the common input node going logical high, slice $210_i$ goes to step 412 and remains there while slice $110_i$ goes to step 307. The slice $110_i$ remains at step 307 until the sequence enable signal $114_i$ goes logical high (as driven by the output $113_P$ of the previous slice $110_{i-1}$ upon the slice $110_{i-1}$ reaching step 311), at which time the slice $110_i$ goes to step 308 and quickly sequences to step 309, then step 310, and stopping at step 311.

Although the present invention has been described in the context of an output buffer having a plurality of (e.g., N) source slices and a plurality of (e.g., N) sink slices, where each slice has a plurality of (e.g., three) output transistors, the invention is not so limited. In general, the present invention can be implemented in the context of any output buffer having two or more output transistors, where the output buffer can be selectively configured (e.g., programmed) in either (1) a slew mode of operation in which two or more output transistors are sequentially turned on or (2) a non-slew mode of operation in which two or more output transistors are turned on substantially simultaneously. In one possible embodiment, an output buffer might have a plurality of source slices and a plurality of sink slices, where each slice has only one output transistor. In another possible embodiment, an output buffer might have only one source slice and only one sink slice, where each slice has a plurality of output transistors. In other possible embodiments, an output buffer might have one or more source slices, but no sink slices, or alternatively one or more sink slices, but no source slices. In still other embodiments, only the slew mode of operation is provided and the output transistors are not turned on simultaneously.

Although the present invention has been described in the context of FPGAs, those skilled in the art will understand that the present invention can be implemented in the context of other types of programmable logic devices (PLDs), such as, without limitation, application specific integrated circuits (ASICs), mask-programmable gate arrays (MPGAs), simple programmable logic device (SPLDs), complex programmable logic devices (CPLDs), digital signal processors (DSPs), and microprocessors. More generally, the present invention can be implemented in the context of any kind of electronic device having logic elements.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not a particular sequence for implementing some or all of those elements, those elements are not necessarily intended to be limited to being implemented in that particular sequence.

The invention claimed is:

1. A programmable logic device comprising an output buffer, the output buffer comprising:
   a first plurality of output transistors, each having a control terminal and two output terminals, wherein the first plurality of output transistors have paralleled output terminals connected between a first reference node and an output node; and
   a first set of one or more pre-drivers, the first set adapted to generate a plurality of control signals, each control signal coupled to the control terminal of a corresponding output transistor of the first plurality of output transistors, the control signals being generated to sequentially turn on two or more of the first plurality of output transistors, wherein the first set of one or more pre-drivers is adapted to be programmably configured to operate in:
      a slew mode in which the control signals are generated to sequentially turn on two or more of the first plurality of output transistors; and
      a non-slew mode in which the control signals are generated to turn on two or more of the first plurality of output transistors substantially simultaneously.

2. The device of claim 1, wherein the output buffer further comprises:
   a second plurality of output transistors, each having a control terminal and two output terminals, wherein the second plurality of output transistors have paralleled output terminals connected between a second reference node and the output node; and
   a second set of one or more pre-drivers, the second set adapted to generate a plurality of control signals, each control signal coupled to the control terminal of a corresponding output transistor of the second plurality of output transistors, the control signals being generated to sequentially turn on two or more of the second plurality of output transistors.

3. The device of claim 2, wherein:
   the first reference node is a power-supply node;
   the second reference node is ground;
   the first set of one or more pre-drivers and the first plurality of output transistors correspond to one or more source slices of the output buffer; and
   the second set of one or more pre-drivers and the second plurality of output transistors correspond to one or more sink slices of the output buffer.

4. The device of claim 2, wherein:
   the two or more of the second plurality of output transistors turn off substantially simultaneously at initiation of the sequentially turning on of the two or more of the first plurality of output transistors; and
   the two or more of the first plurality of output transistors turn off substantially simultaneously at initiation of the sequentially turning on of the two or more of the second plurality of output transistors.

5. The device of claim 1, wherein:
   the first set of pre-drivers comprises two or more pre-drivers serially connected by one or more sequencing enable signals; and
   each previous pre-driver controls the sequencing enable signal for the subsequent pre-driver to enable operations by the subsequent pre-driver only after the previous pre-driver has completed its operations.

6. The device of claim 1, wherein:
   associated with each pre-driver are two or more output transistors of the first plurality of output transistors; and
   each pre-driver generates the corresponding control signals to sequentially turn on the associated two or more output transistors.

7. The device of claim 1, wherein the output buffer further comprises:
   a second plurality of output transistors, each having a control terminal and two output terminals, wherein the second plurality of output transistors have paralleled output terminals connected between a second reference node and the output node; and
   a second set of one or more pre-drivers, the second set adapted to generate a plurality of control signals, each control signal coupled to the control terminal of a corresponding output transistor of the second plurality of output transistors, wherein the second set of one or more pre-drivers is adapted to be programmably configured to operate in:
      a slew mode in which the control signals are generated to sequentially turn on two or more of the second plurality of output transistors; and
      a non-slew mode in which the control signals are generated to turn on two or more of the second plurality of output transistor substantially simultaneously.

8. The device of claim 7, wherein, in both the slew mode and the non-slew mode:
   the two or more of the second plurality of output transistors turn off substantially simultaneously at initiation of the turning on of the two or more of the first plurality of output transistors; and
   the two or more of the first plurality of output transistors turn off substantially simultaneously at initiation of the turning on of the two or more of the second plurality of output transistors.

9. The device of claim 1, wherein:
   the first set of pre-drivers comprises two or more pre-drivers serially connected by one or more sequencing enable signals; and
   in the slew mode, each previous pre-driver controls the sequencing enable signal for the subsequent pre-driver to enable operations by the subsequent pre-driver only after the previous pre-driver has completed its operations.

10. A programmable device comprising an output buffer, the output buffer comprising:
   at least two first-polarity output transistors, each output transistor having a control terminal and two output terminals, wherein the output terminals of the at least two first-polarity output transistors are coupled in parallel between a first node and an output node, the first node adapted to couple to a first power source; and
   at least first and second pre-drivers, each pre-driver having at least first and second input nodes and at least first and second output nodes, each first output node coupling to a corresponding one of the control terminals of the two output transistors, the second input node of the second pre-driver being coupled to the second output node of the first pre-driver, and the first input node of the at least first and second pre-drivers being driven by a first input signal;
   wherein the first and second pre-drivers are each adapted to be programmably configured to operate in:
      a non-slew mode in which an output signal is asserted on the first output node in response to the first input signal being asserted; and
      a slew mode in which, in response to the first input signal on the first input node and an input signal on the second input node being concurrently asserted, an output signal is asserted on the first output node and an output signal is asserted the second output node, the assertion of the output signal on the second output node being delayed with respect to the assertion of the output signal on the first output node.

11. The device of claim 10, wherein the first and second pre-drivers are adapted to negate the output signals on the first output nodes substantially simultaneously after negation of the first input signal.

12. The device of claim 11, further comprising:
at least two additional output transistors, each of the at least two additional transistors having two output terminals and a control terminal, wherein the output terminals of the at least two additional output transistors are coupled in parallel between the first node and an the output node;
wherein each pre-driver further comprises at least one additional input node and at least one additional output node, each additional output node coupling to a control terminal of the corresponding one of the at least two additional output transistors, each pre-driver asserting an output signal on the additional output node in response to the first input signal on the first input node and an input signal on the additional input node being concurrently asserted, and
wherein 1) if the at least first and second pre-drivers are in the slew mode, then the assertion of the output signal on the additional output node is delayed with respect to the assertion of the output signal on the first output node and 2) if the at least first and second pre-drivers are in the non-slew mode, then the output signal on the additional output node and the output signal on the first output node are asserted substantially simultaneously.

13. The device of claim 12, wherein if the at least first and second pre-drivers are operating in the slew mode, then the assertion of the output signal on the second output node is delayed with respect to the assertion of the output signal on the additional output node.

14. The device of claim 12, wherein the at least first and second pre-drivers are additionally responsive to a control input signal, the control input signal determining whether the at least first and second pre-drivers are operating in the slew mode or the non-slew mode.

15. The device of claim 10, wherein a fixed active signal is applied to the second input node of the first pre-driver.

16. The device of claim 10, further comprising:
at least two second-polarity output transistors, each output transistor having a control terminal and two output terminals, wherein the output terminals of the at least two second-polarity output transistors are coupled in parallel between a second node and the output node, the second node adapted to couple to a second power source; and
at least third and fourth pre-drivers, each pre-driver having at least first and second input nodes and at least first and second output nodes, each first output nodes coupling to a corresponding one of the control terminals of the two second-polarity output transistors;
wherein the second input node of the fourth pre-driver is coupled to the second output node of the third pre-driver, and the first input node of the least third and fourth pre-drivers being driven by a second input signal, and
wherein the third and fourth pre-drivers are each adapted to be programmably configured to operate in:
a non-slew node in which an output signal is asserted on the first output node in response to the second input signal being asserted; and
a slew mode in which, in response to the second input signal on the first input node and an input signal on the second input node being concurrently asserted, an output signal is asserted on the first output node and an output signal is asserted the second output node, the assertion of the output signal on the second output node being delayed with respect to the assertion of the output signal on the first output node.

17. A method of operating an output buffer, comprising the steps of:
sequentially sourcing a plurality of currents to an output node in response to a first signal being asserted; and
terminating the sourcing of the plurality of currents to the output node substantially simultaneously upon negation of the first signal, wherein the output buffer supports;
a slew mode in which the sourcing of the plurality of currents to the output node occurs sequentially; and
a non-slew mode in which the sourcing of the plurality of currents to the output node occurs substantially simultaneously.

18. The method of claim 17, further comprising the steps of:
sequentially sinking a plurality of currents from the output node in response to a second signal being asserted; and
terminating the sinking of the plurality of currents from the output node substantially simultaneously upon negation of the second signal;
wherein the step of sequentially sinking the plurality of currents from the output node occurs after the step of terminating the sourcing of the plurality of currents to the output node.

* * * * *

UNITED STATES PATENT AND TRADEMARK OFFICE
CERTIFICATE OF CORRECTION

PATENT NO.         : 7,443,192 B1
APPLICATION NO. : 11/643288
DATED                  : October 28, 2008
INVENTOR(S)       : William B. Andrew et al.

It is certified that error appears in the above-identified patent and that said Letters Patent is hereby corrected as shown below:

Col. 12 line 31 (claim 17) change: "wherein the output buffer supports;" to --wherein the output buffer supports:--

Signed and Sealed this

Twenty-second Day of December, 2009

David J. Kappos
*Director of the United States Patent and Trademark Office*